(12) United States Patent
Yokoyama et al.

(10) Patent No.: US 6,800,423 B2
(45) Date of Patent: Oct. 5, 2004

(54) RADIATION-SENSITIVE COMPOSITION AND METHOD FOR FORMING PATTERNS AND FABRICATING SEMICONDUCTOR DEVICES

(75) Inventors: Yoshiyuki Yokoyama, Tonami (JP); Takashi Hattori, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 6 days.

(21) Appl. No.: 10/294,618

(22) Filed: Nov. 15, 2002

(65) Prior Publication Data

US 2003/0134232 A1 Jul. 17, 2003

(30) Foreign Application Priority Data

Dec. 26, 2001 (JP) ........................................ 2001-393107

(51) Int. Cl.$^7$ ................................................. G03C 5/00
(52) U.S. Cl. ....................... 430/311; 430/313; 430/322; 430/270.1; 430/910; 430/945
(58) Field of Search ................................ 430/311, 313, 430/322, 270.1, 910, 945

(56) References Cited

U.S. PATENT DOCUMENTS

| 6,171,967 B1 | * | 1/2001 | Jun .............................. 438/700 |
| 6,280,897 B1 | * | 8/2001 | Asakawa et al. ......... 430/270.1 |
| 6,455,416 B1 | * | 9/2002 | Subramanian et al. ...... 438/636 |
| 6,458,650 B1 | * | 10/2002 | Huang et al. ................ 438/253 |
| 2002/0068238 A1 | * | 6/2002 | Hada et al. .............. 430/270.1 |

* cited by examiner

Primary Examiner—John A. McPherson
Assistant Examiner—Daborah Chacko-Davis
(74) Attorney, Agent, or Firm—Antonelli, Terry, Stout & Kraus, LLP

(57) ABSTRACT

There is provided a negative radiation-sensitive composition, which is suitable for exposure of a far ultraviolet light comprising a wavelength 193 nm of ArF excimer-laser, freed from causes of resolution deterioration such as swelling due to permeation of a developer and residual of a resist film between lines of the pattern, and capable of forming a high resolution pattern.

The radiation-sensitive composition comprises a polymer of an acrylic acid ester having a γ-hydroxycarboxylic acid in its ester moiety and a photo-acid generator.

23 Claims, 4 Drawing Sheets

RADIATION-SENSITIVE COMPOSITION AND METHOD FOR FORMING PATTERNS AND FABRICATING SEMICONDUCTOR DEVICES

FIELD OF THE INVENTION

The present invention relates to a radiation-sensitive composition used in the field of micro-machining technique, a microlithographic process using the same and a method for fabricating an electronic device, particularly a semiconductor device, which comprises said microlithographic process.

BACKGROUND OF THE INVENTION

Photolithographic techniques forming a micron-order or submicron-order fine patterns have played a core role of micro-machining technique used for the mass-production of electronic devices. The needs toward a higher degree of integration or density of the recent electronic devices, particularly semiconductor devices have led the micro-machining technique to highly progress. Particularly, as the minimum possible machining dimension has been micronized, the photolithographic technique has been increasingly developed with shortening in a wavelength of a light source from g-line (436 nm) and i-line (365 nm) of a high pressure mercury lamp to KrF excimer-laser (248 nm). With respect to a photoresist, a material thereof has changed with changes in the exposure wavelength. Although photoactive compounds or photosensitivity mechanisms are different from one another, an aqueous alkali development making use of solubility of a resin or high molecular material having a phenol structure to an aqueous alkali has been industrially used for the photoresist corresponding to respective wavelengths. Said resin or high molecular material contains a lot of aromatic rings, which have been chemically required from a viewpoint of improving etching resistance in a dry etching step carried out after formation of a resist pattern. Refer to: Elsa Reichmanis, Larry F. Thompson, Polymers in Microlithography; ACS Symposium Series 412; American Chemical Society: Washington, D.C., 1989; P. 1.

As a negative resist of the phenol structure-carrying resin, there are resists of a cross-linking type as disclosed in JP-A-62-164045 (U.S. Pat. No. 5,034,304) and those of a dissolution inhibition type as disclosed in JP-A-4-165359. In any case, submicron-order fine patterns can be formed with no swelling.

In recent years, as the photolithography wherein the minimum possible machining dimension is in a range of much more smaller than 0.25 μm, that using a light source of ArF excimer-laser (193 nm) has been greatly expected. However, said wavelength corresponds to the absorption maximum of the aromatic rings. Accordingly, in case of using the phenol structure-carrying photoresist material so far industrially used, it has been difficult to form fine resist patterns through the aqueous alkali development, because a latent image has restrictedly formed only on an extreme surface of the photoresist film. Refer to: J. Photopolym. Sci. Technol. 6(4), 473–490 (1993).

On the other hand, there have been proposed various resist materials having high dry etching resistance as well as high transmittance within said wavelength range. As a chemical structure other than the aromatic rings, which structure is capable of imparting the dry etching resistance to the resist materials, and which is transparent within a far ultraviolet region comprising the wavelength 193 nm of ArF excimer-laser, JP-A-4-39665 and JP-A-5-265212 disclose use of an adamantan structure, and JP-A-5-80515 and JP-A-5-257284 disclose use of norbornane structure. In addition to these structures, JP-A-7-28237 and JP-A-8-259626 disclose that an alicyclic structure such as a tricyclodecanyl group is generally effective.

With respect to a resist material, which is a high polymer having a chemical structure transparent within a far ultraviolet region comprising the wavelength 193 nm of ArF excimer-laser, and which is usable for the aqueous alkali development, it has been attempted to use a carboxylic acid structure of acrylic acid or methacrylic acid, as disclosed in JP-A-4-39665, JP-A-4-184345, JP-A-4-226461 and JP-A-5-80515. According to these attempts, the carboxylic acid structure of acrylic acid or methacrylic acid serves for solubility to the aqueous alkali as a portion soluble in a developer for the aqueous alkali development. Further, JP-A-8-259626 discloses a high molecular compound formed in a manner such that a carboxylic acid group is attached to an alicyclic structure introduced to a side chain of a methacrylic acid ester.

The phenol structure so far used as the alkali soluble group shows 10.0 of pKa (phenol). Whereas, aforesaid carboxylic acid structure shows a lower value, namely 4.8 of pKa (acetic acid), which means a high acidity. Therefore, in case of using such a carboxylic acid structure for a base resin as the alkali soluble group, rather a resin having such a carboxylic acid structure generally exhibits a large dissolution speed in an aqueous alkali, so long as a molar ratio is the same, and dissolves even in an alkali developer of a low concentration, in which a resin having a phenol structure does not dissolve. Refer to: Pine, Hendrickson, Cram, Hammond Organic Chemistry, Fourth Edition, P. 207.

In case of using the resin having a carboxylic acid as mentioned above, there has been left a problem such that when a cross linking agent as disclosed in JP-A-62-164045 is used, a high acidity carboxylic acid remains on a crosslinked portion, which is therefore subjected to penetration of an alkali developer, thereby causing swelling, and as a result, submicron-order fine patterns cannot be formed. Further, in case of using those capable of forming a compound having a dissolution inhibition action by an acid generated by exposure as disclosed in JP-A-4-165359, there has been left a problem such that the resin having a carboxylic acid gives no dissolution contrast and provides no negative resist.

On the contrary, JP-A-11-109627 discloses a method for forming a non-swelling negative pattern, which uses a phenomenon such that a hydroxycarboxylic acid structure changes to a lactone structure through intramolecular esterification by an acid-catalyzed reaction. The hydroxycarboxylic acid structure is effectively esterified in the molecule by acid-catalyzed reaction, thereby forming a lactone structure. As a result, a number of the carboxylic acid greatly decreases. Therefore, it is quite different from a cross-linking reaction occurring between molecules and showing almost no change in numbers of a carboxylic acid between an exposed portion and an unexposed portion. In conclusion, a developer is hard to penetrate in a portion insolubilized by exposure, and it is possible to control swelling of a pattern after development, which is a problem of a prior art.

With respect to the above-mentioned negative resist using lactonization, JP-A-2000-56459 reports use of a polymer of an α-substituted acrylic acid ester having in its ester moiety a group capable of forming an ester in the molecule through the lactonization. Further, JP-A-2000-352821 reports use of a polymer of an acrylic acid ester or methacrylic acid ester having in its ester moiety a δ-hydroxycarboxylic acid-carrying androsterone structure.

SUMMARY OF THE INVENTION

According to the above-mentioned negative resist using lactonization, the hydroxycarboxylic acid is effectively lactonized at an exposed portion, thereby greatly decreasing the number of carboxylic acid. As a result, a developer is hard to penetrate in a portion insolubilized by exposure, and swelling of a pattern after development, which is a problem of a prior art, can be controlled. However, even according to the above-mentioned system decreasing the carboxylic acid, in the formation of fine patterns of a 0.12 µm level, which has been required for the pattern formation in the field of ArF excimer-laser, there have been left problems such that penetration of a developer cannot be controlled completely, thereby causing swelling, and a resist film remains between lines of the pattern. As a result, a pattern having a good shape could not be obtained.

An object of the present invention is to provide a radiation-sensitive composition capable of forming a high resolution pattern, which is freed from causes of resolution deterioration such as swelling owing to a permeation of a developer and residual of a resist film between lines of the pattern as mentioned above. Another object of the present invention is to provide a method for forming a negative pattern using such a radiation-sensitive composition. A further object of the present invention is to provide a method for fabricating a semiconductor device using such a pattern-forming method.

Incidentally, the present invention is not always based on the assumption that the above-mentioned prior art is used, and the present invention by no means denies the prior art.

The present invention provides a method for fabricating a semiconductor device, which comprises:

the step of arranging a semiconductor substrate;

the step of coating a radiation-sensitive composition containing a polymer of an acrylic acid ester having a γ-hydroxycarboxylic acid in its ester moiety on the semiconductor substrate, thereby forming a coated film; and the step of irradiating the coated film with an actinic radiation, thereby forming a semiconductor circuit pattern.

The present invention further provides a method for fabricating a semiconductor device, which comprises:

the step of forming a first insulation layer on a substrate;

the step of forming an electrically conductive layer on the first insulation layer;

the step of forming a resist film comprising a polymer of an acrylic acid ester having a γ-hydroxycarboxylic acid in its ester moiety on the electrically conductive layer;

the step of subjecting the resist film to a light exposure and a development, thereby forming the resist film into a desired shape;

the step of removing a region of the electrically conductive layer where the resist film is not formed; and the step of forming a second insulation layer.

The present invention further provides a method for fabricating a semiconductor device, which comprises:

the step of forming a first electrically conductive layer on a substrate;

the step of forming an insulation film on the first electrically conductive layer;

the step of forming a positive resist film comprising a polymer of an acrylic acid ester having a γ-hydroxycarboxylic acid in its ester moiety on the insulation film;

the step of subjecting the positive resist film to a light exposure and a development, thereby forming an aperture in the positive resist film;

the step of removing the insulation film naked at the aperture of the positive resist film, thereby exposing the first electrically conductive layer; and the step of forming a second electrically conductive layer to be connected with the first electrically conductive layer.

The present invention further provides a method for fabricating a semiconductor device, which comprises:

the step of forming a first film on a substrate;

the step of forming a resist film comprising a polymer of an acrylic acid ester having a γ-hydroxycarboxylic acid in its ester moiety on the first film;

the step of subjecting the resist film to a light exposure and a development, thereby forming a resist pattern having a minimum dimension W1;

the step of forming a second film on the substrate;

the step of forming a resist film using a resin having a phenol structure on the second film; and the step of subjecting the resist film to a light exposure and a development, thereby forming a resist patter having a minimum dimension W2, which is larger than said W1.

Other objects, features and advantages of the invention will become apparent from the following description of the embodiments of the invention taken in conjunction with the accompanying drawings.

Figure 1:
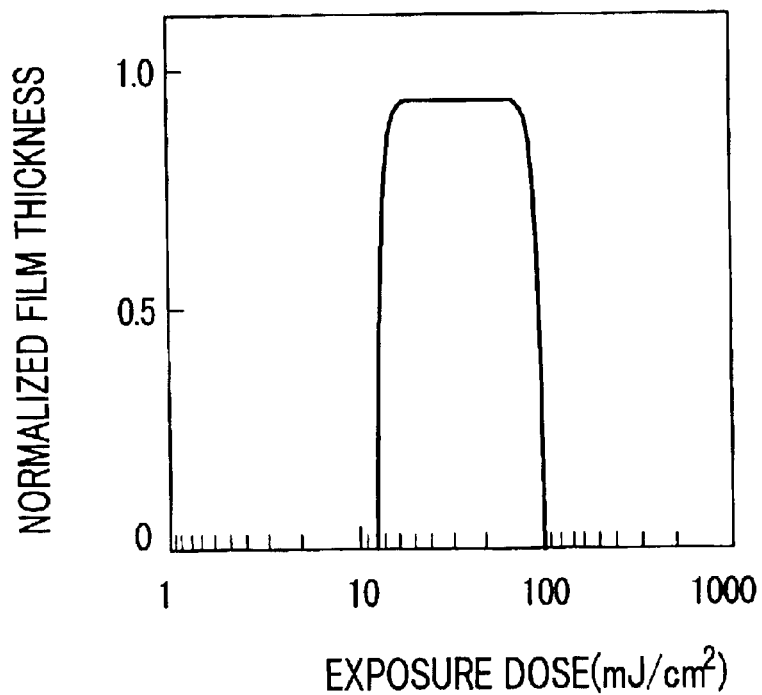
FIG. 1 is a characteristic diagram showing a relation between an exposure dose of ArF excimer-laser and a thickness of a resist residual film after development, which is normalized by assigning an initial film thickness as 1.

Such Figures comprise a field oxide film 25, a source contact 13, a drain contact 14, a source electrode 16, a drain electrode 17, a gate electrode 18, a protective film 19, an oxide film 20, a thermal oxide film 22, a resist pattern 24, a polycrystalline silicon film 26, a resist pattern 27, a polycrystalline silicon gate 28, a P-type silicon wafer 31, an isolation area 32, a word line 33, 42, a side spacer 34, an n-diffusion layer 35, a data line 36, 43, a storage electrode 38, 45, an insulation film for capacitor 39, a plate electrode 40, a wiring 41, an active area 44, a hole for electrode 46, a substrate 100, a wiring 101, a barrier film 102, an interlayer film 103, a hole pattern for wiring 104, a positive resist 105, a hole for wiring 106, a groove pattern for wiring 107, a mask 108, an exposure light of ArF excimer-laser 109, a groove for wiring 110, a copper wiring 111, an anti-reflective layer 112 and an anti-reflective layer 113.

DETAILED DESCRIPTION OF THE INVENTION

Among inventions disclosed in the present specification, a typical one is as follows.

The radiation-sensitive composition comprises a polymer of an acrylic acid ester having a γ-hydroxycarboxylic acid in its ester moiety. Thereby, a high resolution can be realized. Further, the composition can comprise a photo-acid generator, and thereby, a high sensitivity can be realized. In the γ-hydroxycarboxylic acid structure of the polymer, an alcohol, which is the other party in the esterification of the carboxylic acid, exists at a γ-position of the carboxylic acid in the molecule, and therefore it is easier to cause the esterification through an acid-catalyzed reaction than usual. Since the reaction is the esterification in the molecule, no cross-linking occurs between molecules, and an amount of the carboxylic acid simply varies between an exposed portion and an unexposed portion. The produced ester is not subjected to hydrolysis in an aqueous tetraalkylammonium hydroxide solution usually used, and so stable during the development. Therefore, a dissolution speed can be varied greatly, swelling can be avoided and submicron-order fine patterns can be formed. The polymer used for the radiation-sensitive composition in accordance with the present invention may have more than one kind of γ-hydroxycarboxylic acid structures different from one another.

There is also known a δ-hydroxycarboxylic acid structure as that forming a lactone structure through intramolecular esterification. However, the γ-hydroxycarboxylic acid structure is higher in the reaction efficiency and greater in decrease of numbers of the carboxylic acid at an exposed portion, and therefore it is easier to control penetration of the developer and to form a pattern with a high sensitivity.

As compared with a polymer of an α-substituted acrylic acid ester, the present polymer of the acrylic acid ester is more hydrophilic in its main chain structure. Therefore, rather the polymer of the acrylic acid ester exhibits better solubility of an unexposed portion to an alkali developer. As a result, residual of a resist film between lines of the pattern, which causes resolution deterioration, can be reduced. When a proportion of the hydroxycarboxylic acid structure in the polymer is too large, the unreacted carboxylic acid remaining at an exposed portion relatively increases to cause swelling. Therefore, it is preferred to decrease the proportion of the hydroxycarboxylic acid structure in the polymer in a manner such that the proportion is not less than that, according to which a film-forming component becomes soluble in the alkali developer. In case of using the polymer of the acrylic acid ester, the main chain structure exhibits a high hydrophilic property. Therefore it is possible to more decrease a proportion of the hydroxycarboxylic acid in the polymer as compared with the case where the polymer of the α-substituted acrylic acid ester is used. As a result, it becomes easy to control swelling due to penetration of the developer. Further, the polymer of the acrylic acid ester contains no quaternary carbon atom in its main chain structure. Therefore, the main chain structure is hard to cut during dry etching procedure, and a surface roughness, which is a problem when the polymer of α-substituted acrylic acid ester is used, can be controlled.

Incidentally, the acid required for causing the acid-catalyzed reaction can be prepared by using the photo-acid generator capable of generating an acid by means of irradiation with an actinic radiation.

The polymer used for the above-mentioned radiation-sensitive composition can have a repeating unit represented by the following formula (1), (2) or (3),

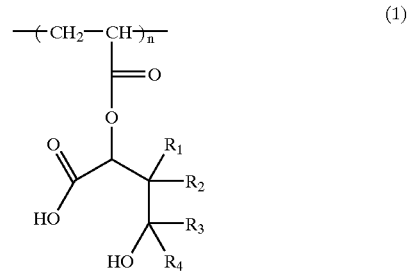

(1)

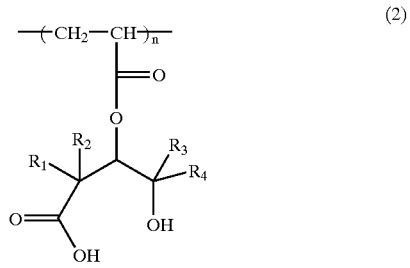

(2)

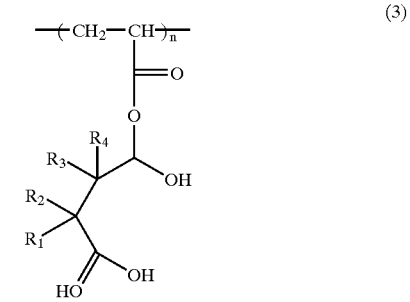

(3)

wherein $R^1$, $R^2$, $R^3$ and $R^4$ are independently of one another a hydrogen atom or an alkyl group having 1 to 10 carbon atoms, and these alkyl groups can be bound with one another to form a cyclic alkyl group.

The polymer having the repeating unit represented by the formula (1), (2) or (3) can be easily obtained by hydrolysis of a polymer having a repeating unit represented by the following formula (4), (5) or (6), wherein a γ-lactone cyclic structure thereof is partially or wholly hydrolyzed to form a γ-hydroxycarboxylic acid structure,

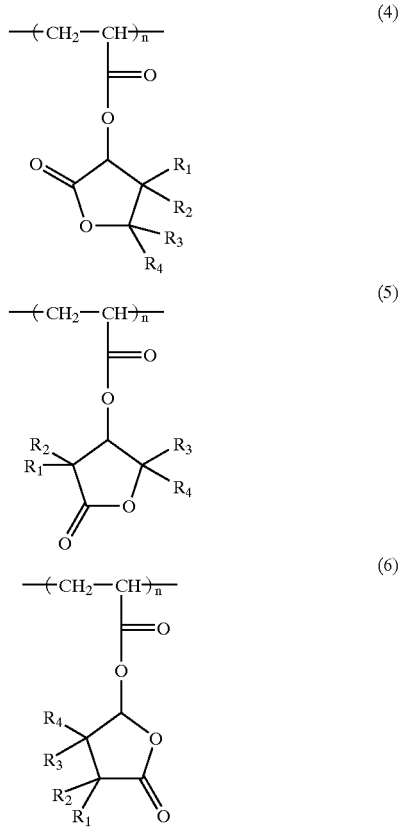

wherein $R^1$, $R_2$, $R^3$ and $R^4$ are as defined above.

The polymer used for the above-mentioned radiation-sensitive composition can be a copolymer of the acrylic acid ester having a γ-hydroxycarboxylic acid in its ester moiety and another acrylic acid ester other than that or an α-substituted acrylic acid ester. When such a copolymer is used, it is possible to vary characteristic features of the radiation-sensitive composition to the purpose of use or a method of use of the radiation-sensitive composition. At this time, it is appropriate that a molar ratio in the copolymer of the acrylic acid ester having a γ-hydroxycarboxylic acid in its ester moiety is within a range of from 5% (inclusive) to 35% (inclusive). When the molar ratio is less than 5%, the copolymer does not exhibit a sufficient solubility to the alkali developer. When it exceeds 35%, remarkable deterioration of sensitivity is caused, and at the same time swelling due to the penetration of developer easily occurs. The copolymer may be used for the above-mentioned radiation-sensitive composition in a combination of two or more thereof.

The α-substituted acrylic acid ester includes, for example, methacrylic acid esters, α-(hydroxylmethyl)acrylic acid esters and α-(trifluoromethyl)acrylic acid esters, but it is not limited thereto.

For the purpose of improving adhesion between the copolymer and a substrate, it is effective that the acrylic acid ester other than the acrylic acid ester having a γ-hydroxycarboxylic acid in its ester moiety or the α-substituted acrylic acid ester in the above-mentioned copolymer has a polar group such as lactone, an ester group and a hydroxy group in its ester moiety. The ester moiety having a polar group includes, for example, a γ-lactone group, a dimethyl-γ-lactone group, a δ-lactone group, an adamantyllactone group, a 3-hydroxyadamantyl group, a hydroxymethyl group, a hydroxyethyl group and hydroxytricyclo[5,2,1,0]decyl group, but it is not limited only thereto.

For the purpose of imparting dry etching resistance to the copolymer, it is effective that either the acrylic acid ester other than the acrylic acid ester having a γ-hydroxycarboxylic acid in its ester moiety or the α-substituted acrylic acid ester in the above-mentioned copolymer has an alicyclic group in its ester moiety. The alicyclic group includes, for example, a cyclohexyl group, a tricyclo[5,2,1,0]decyl group, an adamantyl group, a norbornyl group, a cholesterol group and a naphthalene group, but it is not limited only thereto.

For the purpose of imparting transparency within a far ultraviolet region comprising a wavelength such as 193 nm and 157 nm, it is effective that either the acrylic acid ester other than the acrylic acid ester having a γ-hydroxycarboxylic acid in its ester moiety or the α-substituted acrylic acid ester in the above-mentioned copolymer has a fluorinated hydrocarbon group in its ester moiety. Further, the supra-repellency peculiar to the fluorinated hydrocarbon group is effective for controlling swelling due to the penetration of developer. The fluorinated hydrocarbon group includes, for example, a perfluorophenyl group, a perfluorocyclohexylmethyl group, a perfluoroadamantyl group, a perfluorooctylmethyl group and perfluorohexylhydroxypropyl group, but it is not limited only thereto. From a viewpoint of dry etching resistance, more preferred are cyclic structure-carrying fluorine-containing hydrocarbon groups such as a perfluorophenyl group, a perfluorocyclohexylmethyl group and a perfluoroadamantyl group.

It is permitted that either the acrylic acid ester other than the acrylic acid ester having a γ-hydroxycarboxylic acid in its ester moiety or the α-substituted acrylic acid ester in the above-mentioned copolymer has in its ester moiety a group decomposing by the action of an acid, thereby increasing solubility to the alkali developer. With respect to the above-mentioned copolymer, in a portion to which an actinic radiation is applied in a low exposure dose, the hydroxycarboxylic acid structure changes to a lactone structure by the action of an acid, thereby once making said portion insoluble in the developer. However, in a portion to which an actinic radiation is applied in a high exposure dose, the group which decomposes by the action of an acid to increase solubility to the alkali developer starts to decompose, thereby making the portion again soluble in the developer. That is, the exposure dose can be arbitrarily selected, so that the pattern can be separately formed into a negative pattern at a low exposure dose and a positive pattern at a high exposure dose. The group decomposing by the action of an acid, thereby increasing solubility to the alkali developer, includes, for example, alkoxyalkyl and cyclic alkoxyalkyl groups such as tertiary alkyl groups including a tert-butyl group, a tert-pentyl group, 2-methyladamantyl group, 2-ethyladamantyl group, 1-adamantyl group and 3-hydroxy-1-adamantyl group, and others including 1-ethoxyethyl group, 1-methoxypropyl group, a tetrahydrofuranyl group and a tetrahydropyranyl group, but it is not limited only thereto.

The polymer in the above-mentioned radiation-sensitive composition has a weight average molecular weight of preferably from 800 to 500,000. When the weight average molecular weight is less than 800, a resist film may not be formed. When it exceeds 500,000, the film formed may produce cracks.

The photo-acid generator is used in an amount of desirably from 0.1 to 50 parts by weight, and more desirably from 0.5 to 20 parts by weight, based on the weight of the above-mentioned polymer.

The photo-acid generator can be a compound generating an acid through application of an actinic radiation such as ArF excimer-laser. The compound includes, for example, onium salts such as triphenylsulfonium triflate, triphenylsulfonium nonaflate, dimethylphenylsulfonium triflate and dimethyl-4-hydroxynaphthyl triflate, sulfonyloxyimides such as N-trifluoromethanesulfonyloxy-naphthylimide, N-methanesulfonyloxy-naphthylimide, N-trifluoromethanesulfonyloxy-succinimide and N-perfluorooctanesulfonyloxy-succinimide, and sulfonic acid esters, but it is not limited thereto. The photo-acid generator may be used in combination of two or more thereof.

For the purposes of improving resolution and improving process stability and storage stability, it is permitted to add basic compounds such as 2-benzylpyridine, tripentylamine and triethanolamine, and salts such as tetramethylammonium iodide, tetrapentylammonium chloride and tetraethylphosphonium iodide to the above-mentioned radiation-sensitive composition. It is desirable that these basic compounds and the salts are added in an amount of from 0.01 to 100 parts by weight based on 100 parts by weight of the photo-acid generator used.

Further for the purpose of improving heat resistance of the pattern formed, the above-mentioned radiation-sensitive composition may contain a cross-linking agent such as hexamethoxymelamine, 1,3,4,6-tetraxis(methoxymethyl) glycoluril and 1,4-dioxane-2,3-diol. It is desirable that such a cross-linking agent is used in an amount of from 0.1 to 50 parts by weight based on 100 parts by weight of the film-forming component in the radiation-sensitive composition.

Still further for the purposes of controlling the solubility to developer and improving resolution, the radiation-sensitive composition in accordance with the present invention may contain as a low molecular weight compound a compound, which can be obtained from cholic acid, abietic acid or (epi)androsterone, and which is represented by the following formula (7),

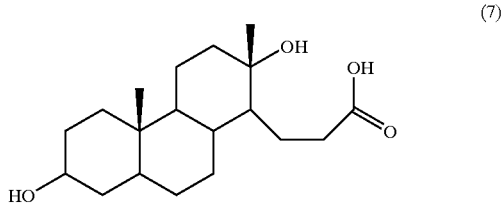

(7)

or an oligomer formed by bonding more than one compound defined above. It is desirable that such a low molecular weight compound is used in an amount of desirably from 1 to 50 parts by weight based on 100 parts by weight of the film-forming component in the radiation-sensitive composition.

In using, the above-mentioned radiation-sensitive composition is dissolved in a solvent to obtain a solution, which is then spin-coated on a substrate. At this time, the solvent may be any one as far as it can dissolve the above-mentioned constitution components thoroughly and a uniform coated film can be obtained by means of spin-coating. Examples thereof are propylene glycol methyl ether, propylene glycol methyl ether acetate, ethyl lactates, cyclohexanone, methyl amyl ketone and diacetone alcohol, but the solvent is not limited thereto. The solvent may be used singly or in a mixture of two or more.

For the purpose of improving storage stability, a solution containing the above-mentioned radiation-sensitive composition may be mixed with a compound capable of increasing a polarity of the solution. Such a compound includes, for example, water, ethanol, γ-lactone and tetrahydrofuran. Further, it is effective to add thereto a compound capable of maintaining the solution alkaline. Such a compound includes, for example, ammonia, trimethylamine, pyridine and tetramethylammonium hydroxide.

The pattern-forming method in accordance with the present invention comprises a step of forming a coated film comprising any of the radiation-sensitive compositions described above on a pre-determined substrate, a step of irradiating the coated film in a pre-determined pattern with an actinic radiation, a step of heating the substrate after completion of the irradiation with an actinic radiation and a step of exposing the coated film to an aqueous alkali solution after completion of heating the substrate, thereby removing a portion unexposed with the actinic radiation. According to the present pattern-forming method, a pattern having high resolution can be formed with no resolution deterioration owing to the penetration of developer and residual of the resist film between lines of the pattern.

In order to apply the actinic radiation in a pre-determined pattern, the application of actinic radiation is carried out through a mask or reticle of a pre-determined pattern. At this time, it is desirable to use a resolution enhancement technique such as oblique illumination and phase shift mask, thereby obtaining a higher resolution pattern.

The actinic radiation used in the present invention includes, for example, a vacuum ultraviolet light such as far ultraviolet light, AtF excimer-laser light and F2 excimer-laser light, which are not more than 250 nm in their wavelength. It is also permitted to use electron-beam, EUV and X-ray.

The alkali developer used in the present invention is preferably an aqueous solution of a tetraalkylammonium hydroxide having 1 to 5 carbon atoms. Its concentration is preferably from 0.1 to 0.5 wt %. When the concentration of the aqueous tetraalkylammonium hydroxide solution is less than 0.1 wt %, exhaustion of the developer causes insufficient development and a residual of the resist material appears between the patterns. When it exceeds 0.5 wt %, as the concentration raises, swelling appears at the development.

The pattern-forming method in accordance with the present invention is suitable for forming submicron-order fine groove patterns, because the problems of swelling due to the penetration of developer and the residual of the resist material between patterns can be controlled. As compared with the formation of groove pattern using a positive resist and a positive mask pattern, it is more advantageous to form the groove pattern using a negative mask pattern according to the present pattern-forming method, because an exposure latitude and a defocus latitude can be made large.

In case of using the radiation-sensitive composition comprising the copolymer obtained using either the acrylic acid ester other than the acrylic acid ester having a γ-hydroxycarboxylic acid in its ester moiety or the α-substituted acrylic acid ester, which has in its ester moiety a group decomposing by the action of an acid, thereby increasing solubility to the alkali developer, a first exposing step of applying an actinic radiation in a pre-determined pattern and a second exposing step of applying an actinic radiation in an exposure dose more than that in the first exposing step can be provided as the step of irradiating the coated film with an actinic radiation, so that a negative pattern and a positive pattern can be formed at the exposed portion of the first step and the exposed portion of the second step, respectively. That is, it is possible to remove only an unnecessary portion in the negative pattern obtained through the first exposure in a manner such that the unnecessary portion is made positive through the second exposure, and then developed. In a conventional exposing process so far used, wherein a resist coated on a surface of semiconductor wafer is exposed through a reticle or a photo-mask, it is usual that after such an exposure of the device, further the resist on an edge portion of the semiconductor device is selectively exposed and then removed. By the pattern-forming method in accordance with the present invention, it is made possible that a negative pattern is formed on a device, and at the same time such an edging exposure can be carried out to remove an unnecessary resist film of the edge portion. In the above-mentioned pattern-forming method, it is permitted to carry out a step of heating the substrate and a developing step after carrying out the first exposure and the second exposure. It is also permitted to carry out respective steps of heating the substrate after carrying out the first exposure and of heating the substrate after carrying out the second exposure, and finally carry out a developing step. It is further permitted to carry out a step of heating the substrate and a developing step after the first exposure and then carry out a step of heating the substrate and a developing step after the second exposure. An order of the first exposure and the second exposure may be reversed. A wavelength of the actinic radiation used in the first exposure and the second exposure may be different from each other.

Further, the present invention comprises a method for fabricating a semiconductor device, which comprises a step of forming a resist pattern on a semiconductor substrate according to any of the pattern-forming methods mentioned above, and a step of processing the substrate by means of etching or ion-implantation.

The processing by means of etching used in the above-mentioned method for fabricating a semiconductor device includes, for example, dry etching and wet etching such as plasma etching, reactive ion etching and reactive ion beam etching.

The substrate processed according to the above-mentioned method for fabricating a semiconductor device includes, for example, oxidation films such as a silicon dioxide film and a coating glass film, which are formed by CVD method or thermal oxidation method, and nitride films such as a silicon nitride film. Further, the substrate includes films of various metals such as aluminum and its alloy and tungsten, and polycrystalline silicon.

The above-mentioned method for fabricating a semiconductor device is superior for processing a fine groove structure. Therefore, it is suitable for a damascene process, wherein a groove for wiring is formed on an interlayer and a conductor is buried therein to form a wiring circuit for a semiconductor device. It is also suitable for a dual damascene process, wherein both a hole for continuity and a groove for wiring are formed and a conductor is buried therein to perform wiring and wiring contact.

When an element, particularly a memory element is obtained according to the above-mentioned method for fabricating a semiconductor device, fine patterns can be formed to increase a degree of its integration. Therefore, the element can be minimized to increase a number of the element obtainable from one sheet of a wafer, and as a result, yield can be increased. Further, a bit cost can be decreased. Thus, it is suitable for the production of a flush memory and DRAM (dynamic random access memory), which are fixed semiconductor memory devices.

EXAMPLES

Mode for Carrying Out the Invention 1

In 200 ml of tetrahydrofuran, 10 g of 2-hydroxy-3,3-dimethyl-γ-lactone and 9 g of pyridine were dissolved. A solution prepared by dissolving 7.5 g of acryloyl chloride in 30 ml of tetrahydrofuran was dropped thereto at 0° C. After completion of dropping, the mixture was further stirred at ambient temperature for 12 hours, and thereafter, the precipitated pyridine hydrochloride was separated by filtration. To the filtrate, 300 ml of ethyl acetate was added, and the mixture was washed 4 times with 200 ml of water. After completion of washing, the organic layer was dried over anhydrous sodium sulfate, and thereafter the solvent was removed by distillation under reduced pressure. The residue was purified by distillation under reduced pressure, thereby obtaining a colorless transparent acrylate monomer (8).

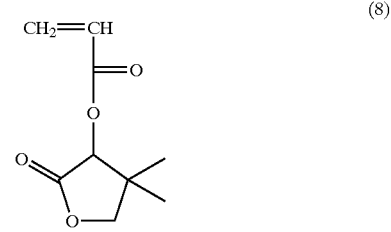

(8)

In 100 ml of tetrahydrofuran, 5 g ($2.7 \times 10^{-2}$ mol) of the above acrylate monomer (8) and 24 g ($1.1 \times 10^{-1}$ mol) of 3-hydroxy-1-adamantyl acrylate monomer were dissolved so as to make a molar ratio 2:8, and nitrogen bubbling was conducted for 10 minutes. Successively, 1.5 g of dimethyl-2,2'-azobisisobutylate was added thereto as a polymerization initiator, and polymerization was continued at 60° C. for 12 hours under nitrogen atmosphere. After completion of the polymerization, the resulting solution was poured to 1 liter of n-hexane to precipitate a polymer. The polymer was separated by filtration and dried, thereby obtaining a white polymer. According to various analyses, the obtained polymer was found to be a copolymer (9) of an acrylic acid ester having a γ-lactone structure in its ester moiety, wherein a molar ratio of the ester was 20%.

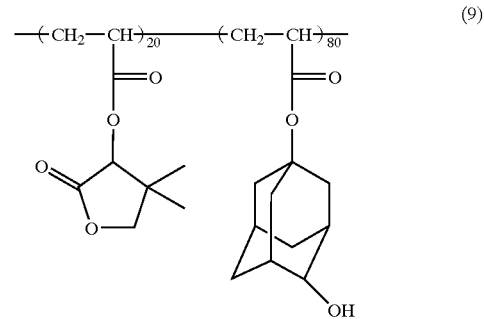

(9)

In 250 ml of tetrahydrofuran, 15 g of the above-obtained copolymer (9) was dissolved, 150 ml of 0.13 N aqueous tetramethylhydroxide solution was added thereto, and the mixture was stirred for 6 hours. An aqueous hydrochloric acid solution was gradually added to make the solution acidic. To the resulting solution, about 500 ml of ethyl acetate was added to perform extraction 2 times, and the obtained organic layer was washed 2 times with 500 ml of water. After completion of washing, the organic layer was dried over anhydrous sodium sulfate. Thereafter, distillation under reduced pressure was carried out to diminish the solvent, and the residue was poured to 1 liter of n-hexane. The precipitate was separated by filtration and dried, thereby obtaining a white polymer. According to various analyses, the obtained polymer was found to be a copolymer (10) of an acrylic acid ester having a γ-hydroxycarboxylic acid structure in its ester moiety, wherein a molar ratio of the ester was 20%.

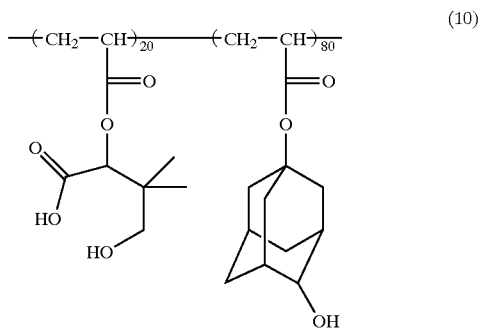
(10)

A molecular weight calibrated with polystyrene standard was examined in tetrahydrofuran according to gel-permeation chromatography, and thereby the weight average molecular weight and the number average molecular weight were found to be 5,000 and 4,000, respectively.

Next, 100 parts by weight of the above polymer, 1 part by weight of a photo-acid generator, triphenysulfonium non-aflate and 0.2 part by weight of 4-phenylpyridine were dissolved in 1200 parts by weight of 1-methoxy-2-propanol, and the solution was filtered using a Teflon filter having a pore diameter of 0.20 μm, thereby obtaining a resist solution.

On a silicon substrate treated with hexamethylsilazane, the above resist solution was spin-coated, and thereafter heat-treated at 100° C. for 60 seconds, thereby forming a resist film having a thickness of 0.30 μm. Exposure of the resist film was carried out through a levenson-type phase shift mask using ArF excimer-laser stepper (ISI Microstep, NA=0.60). After completion of the exposure, a post-exposure baking was carried out at 120° C. for 60 seconds. Thereafter, using an aqueous tetramethylammonium hydroxide solution (0.113% by weight), development was carried out for 10 seconds, and successively, the resultant was rinsed for 30 seconds with pure water. As a result, there was obtained a negative 0.10 μm line and space pattern at 30 mJ/cm². Neither swelling of the pattern nor residual between pattern lines was observed.

Further, a line and space pattern exposure was applied to the resist using an electron beam drawing apparatus of an acceleration voltage of 50 kV. Post-baking and development were carried under the same conditions as in the ArF excimer-laser exposure, thereby obtaining a negative 0.08 μm line and space pattern at an exposure dose of 7 μC/cm². At this time, neither swelling of the pattern nor residual between pattern lines was observed.

Even when the resist solution was stored for 30 days at ambient temperature (23° C.), no change was observed in its sensitivity and resolution, and thus its storage stability was found to be good.

Further, with respect to the resist film, etching was carried out with a parallel plate type reactive ion etching apparatus using CHF₃ gas under conditions of 35 sccm of CHF₃ flow rate, 10 mTorr of gas pressure and 150 W of RF bias power. As a result, an etching rate of the resist was found to be 1.2, provided that an etching rate in case of using a commercially available novolak resin was assigned to be 1.0. No surface roughness was observed after the dry etching, and therefore the resist was found to have a high dry etching resistance.

Mode for Carrying Out the Invention 2

100 Parts by weight of the polymer obtained in Mode for carrying out the invention 1,1 part by weight of a photo-acid generator, triphenysulfonium triflate and 0.5 part by weight of triphenylsulfonium nonaflate, 0.2 part by weight of triethanolamine and 10 parts by weight of the carboxylic acid-carrying low molecular compound (7) were dissolved in 1200 parts by weight of 1-methoxy-2-propanol, and the solution was filtered using a Teflon filter having a pore diameter of 0.20 μm, thereby obtaining a resist solution. For the purpose of improving storage stability, 0.5N aqueous ammonia solution was further added to the resist solution.

Like in Mode for carrying out the invention 1, exposure of the resist film was carried out through a levenson-type phase shift mask using ArF excimer-laser stepper (ISI Microstep, NA=0.60). After completion of the exposure, post-exposure baking was carried out at 120° C. for 60 seconds. Thereafter, using an aqueous tetramethylammonium hydroxide solution (2.38% by weight), development was carried out for 10 seconds, and successively, the resultant was rinsed for 30 seconds with pure water. As a result, there was obtained a negative 0.10 μm line and space pattern at 50 mJ/cm². Thereby, neither swelling of the pattern nor residual between pattern lines was observed.

Even when the resist solution was stored for 90 days at ambient temperature (23° C.), no change was observed in its sensitivity and resolution, and thus its storage stability was found to be good.

Mode for Carrying Out the Invention 3

Mode for carrying out the invention 1 was repeated, except that 2-hydroxy-3,3-dimethyl-γ-lactone was changed to 4-hydroxy-γ-butyrolactone. According to various analyses, the obtained polymer was found to be a copolymer (11) of an acrylic acid ester having a γ-hydroxycarboxylic acid structure in its ester moiety, wherein a molar ratio of the ester was 20%.

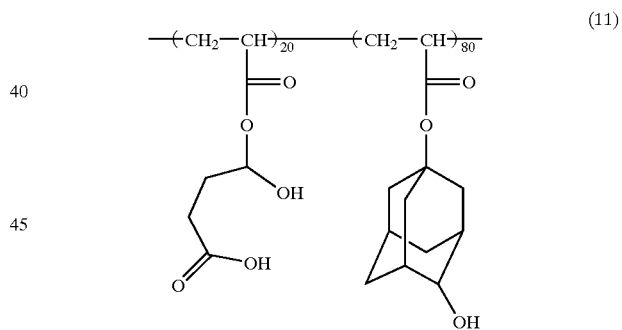
(11)

A molecular weight calibrated with polystyrene standard was examined in tetrahydrofuran according to gel-permeation chromatography (GPC), and then the weight average molecular weight and the number average molecular weight were found to be 5,500 and 4,300, respectively.

Next, like in Mode for carrying out the invention 1, formation of submicron-order fine patterns was carried out using a levenson-type phase shift mask and ArF excimer-laser stepper (ISI Microstep, NA=0.60). Then, there was obtained a negative 0.10 μm line and space pattern at 40 mJ/cm². Thereby, neither swelling of the pattern nor residual between pattern lines was observed.

Mode for Carrying Out the Invention 4

Mode for carrying out the invention 1 was repeated, except that 3-hydroxy-1-adamantyl acrylate monomer was changed to adamantyllactone methacrylate monomer. According to various analyses, the obtained polymer was found to be a copolymer (12) of an acrylic acid ester having a γ-hydroxycarboxylic acid structure in its ester moiety, wherein a molar ratio of the ester was 20%.

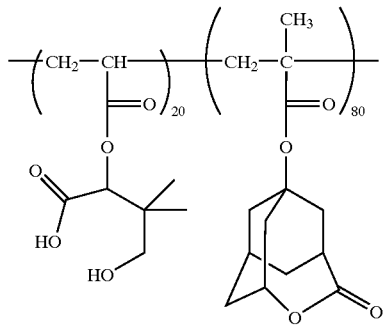

(12)

A molecular weight calibrated with polystyrene standard was examined in tetrahydrofuran according to gel-permeation chromatography (GPC), and then the weight average molecular weight and the number average molecular weight were found to be 5,400 and 4,200, respectively.

Next, like in Mode for carrying out the invention 1, formation of submicron-order fine patterns was carried out using a levenson-type phase shift mask and ArF excimer-laser stepper (ISI Microstep, NA=0.60). Then, there was obtained a negative 0.10 μm line and space pattern at 35 mJ/cm². Thereby, neither swelling of the pattern nor residual between pattern lines was observed.

Mode for Carrying Out the Invention 5

Mode for carrying out the invention 1 was repeated, except that 3-hydroxy-1-adamantyl acrylate monomer was changed to α-hydroxymethylacrylic acid methyl ester. According to various analyses, the obtained polymer was found to be a copolymer (13) of an acrylic acid ester having a γ-hydroxycarboxylic acid structure in its ester moiety, wherein a molar ratio of the ester was 20%.

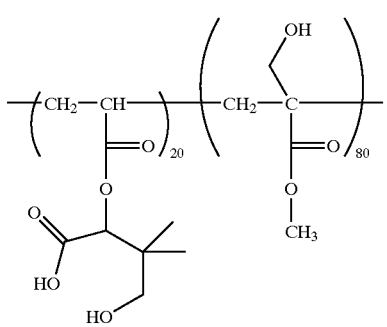

(13)

A molecular weight calibrated with polystyrene standard was examined in tetrahydrofuran according to gel-permeation chromatography (GPC), and then the weight average molecular weight and the number average molecular weight were found to be 6,000 and 5,000, respectively.

Next, like in Mode for carrying out the invention 1, formation of submicron-order fine patterns was carried out using a levenson-type phase shift mask and ArF excimer-laser stepper (ISI Microstep, NA=0.60). Then, there was obtained a negative 0.10 μm line and space pattern at 50 mJ/cm². Thereby, neither swelling of the pattern nor residual between pattern lines was observed.

Mode for Carrying Out the Invention 6

Mode for carrying out the invention 1 was repeated, except that 3-hydroxy-1-adamantyl acrylate monomer was changed to perfluorohexyl-2-hydroxypropyl acrylate monomer. According to various analyses, the obtained polymer was found to be a copolymer (14) of an acrylic acid ester having a γ-hydroxycarboxylic acid structure in its ester moiety, wherein a molar ratio of the ester was 20%.

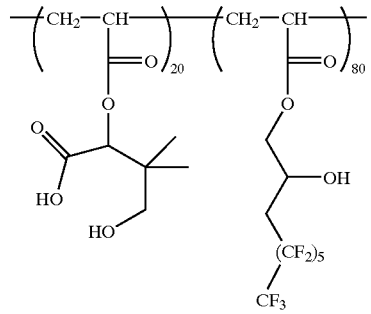

(14)

A molecular weight calibrated with polystyrene standard was examined in tetrahydrofuran according to gel-permeation chromatography (GPC), and then the weight average molecular weight and the number average molecular weight were found to be 4,000 and 3,200, respectively.

Next, using a vacuum ultraviolet spectrometer, absorption spectra of the film coated on a lithium fluoride substrate were measured. The absorption of a 1.0 μm film thickness was found to be low, such as 0.22 at 193 nm and 1.8 at 157 nm.

Next, like in Mode for carrying out the invention 1, formation of submicron-order fine patterns was carried out using a levenson-type phase shift mask and ArF excimer-laser stepper (ISI Microstep, NA=0.60). Then, there was obtained a negative 0.10 μm line and space pattern at 60 mJ/cm². Thereby, neither swelling of the pattern nor residual between pattern lines was observed. Further, formation of submicron-order fine patterns was carried out using a levenson-type phase shift mask and F₂ excimer-laser stepper (NA=0.60). Then, there was obtained a negative 0.08 μm line and space pattern at 10 mJ/cm². Thereby, neither swelling of the pattern nor residual between pattern lines was observed.

Mode for Carrying Out the Invention 7

Mode for carrying out the invention 1 was repeated, except that 3-hydroxy-1-adamantyl acrylate monomer was changed to 2-methyladamantyl acrylate monomer. According to various analyses, the obtained polymer was found to be a copolymer (15) of an acrylic acid ester having a γ-hydroxycarboxylic acid structure in its ester moiety, wherein a molar ratio of the ester was 20%.

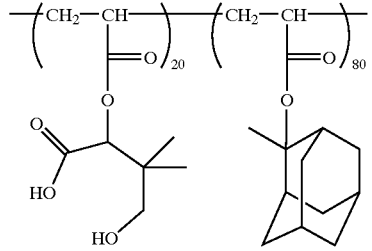

(15)

A molecular weight calibrated with polystyrene standard was examined in tetrahydrofuran according to gel-permeation chromatography (GPC), and then the weight average molecular weight and the number average molecular weight were found to be 5,200 and 4,500, respectively.

Next, a resist film was formed in a manner similar to that of Mode for carrying out the invention 1, and then an actinic radiation was applied thereto to examine a relation between an exposure dose and a resist film thickness after development. The actinic radiation used was ArF excimer-laser (wavelength 193 nm). After completion of the exposure, a post-exposure baking was carried out at 120° C. for 60 seconds. Thereafter, using an aqueous tetramethylammonium hydroxide solution (0.113% by weight), development was carried out for 30 seconds, and successively, the resultant was rinsed for 30 seconds with pure water. A result of the examination of a relation between the exposure dose and the resist film thickness after development is shown in FIG. 1. According to this, it was found that the resist film was once made insoluble in the alkali developer when exposed at 30 mJ/cm$^2$, and when further exposed at 100 mJ/cm$^2$ or more, the film was again made soluble therein.

Next, a resist film was formed in a manner similar to that of Mode for carrying out the invention 1, and then 40 mJ/cm$^2$ of ArF excimer-laser was applied thereto in the form of a line and space pattern. Thereafter, 150 mJ/cm$^2$ of ArF excimer-laser was further applied to a part of the exposed portion in the spot form. After completion of the exposure, a post-exposure baking was carried out at 120° C. for 60 seconds. Thereafter, using an aqueous tetramethylammonium hydroxide solution (0.113% by weight), development was carried out for 30 seconds, and successively, the resultant was rinsed for 30 seconds with pure water. A portion where 150 mJ/cm$^2$ of ArF excimer-laser had been applied was made soluble in the developer, and a line and space patter wherein such a portion was removed in the spot form was obtained.

Next, a resist film was formed on a silicon wafer in a manner similar to that of Mode for carrying out the invention 1. An edge exposing apparatus having a Xe—Hg lamp as a light source was operated so as to go around the wafer 3 times at a speed of 20 second/round, during which only the edge of the wafer was exposed. At this time, an exposing intensity of the edge exposing apparatus was adjusted so as to make an exposure dose of the wafer edge 150 mJ/cm$^2$. Thereafter, the whole surface of the wafer was irradiated in a circuit pattern so as to attain 40 mJ/cm$^2$ of an exposure dose. Thereafter, a post-exposure baking was carried out at 120° C. for 60 seconds. Thereafter, using an aqueous tetramethylammonium hydroxide solution (0.113% by weight), development was carried out for 30 seconds, and successively, the resultant was rinsed for 30 seconds with pure water. As a result, the resist at a portion of the wafer edge was completely removed, and at the same time, a negative circuit pattern could be obtained. At this time, neither swelling of the pattern nor residual between pattern lines was observed.

Mode for Carrying Out the Invention 8

Figure 2:
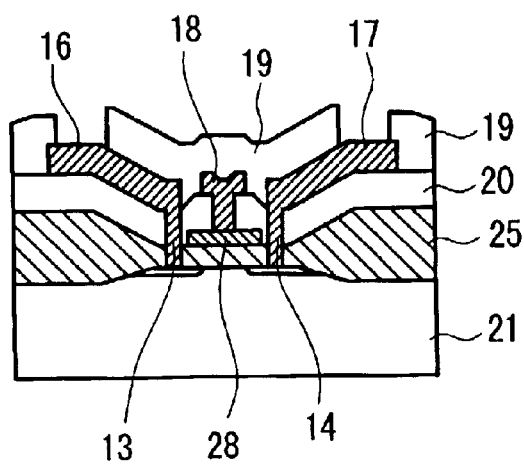
FIG. 2 is a sectional view of a MOS (metal-oxide-semiconductor) type transistor.

In FIG. 2, a sectional view of a known MOS (metal-oxide-semiconductor) type transistor is shown. The transistor has a structure so as to control a drain current flowing between a source electrode 16 and a drain electrode 17 with the aid of voltage applied to a gate electrode 18.

Here, a process for obtaining such a structure comprises ten and some procedures. These can be roughly divided into three groups of a procedure reaching the formation of a field oxide film, a procedure reaching the formation of a gate and a final procedure. The first procedure reaching the formation of a field oxide film (FIG. 3) comprises a step of forming a resist pattern on a silicon nitride film. The field oxide film was formed in a manner of the following Example.

Figure 3A:
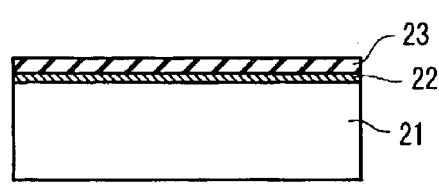
FIG. 3A to FIG. 3H are element sectional views showing a method for forming a field oxide film and a silicone gate using the pattern-forming method in accordance with the present invention.
Figure 3E:
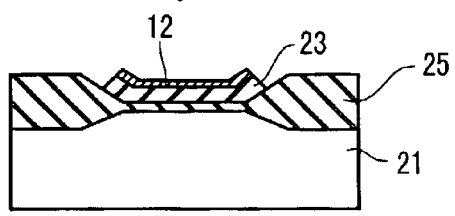
Figure 3B:
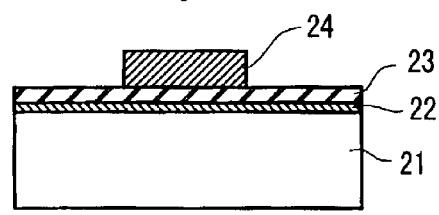

As in FIG. 3(a), a 50 nm oxide film 22 is formed on a p-type silicon wafer 21 according to a conventional method, and a 200 nm silicon nitride film 23 is formed thereon according to plasma CVD, thereby obtaining a substrate. A resist pattern (24) having a 0.30 μm line is formed on the substrate using the same materials and the same manner as those in Mode for carrying out the invention 1 (FIG. 3(b)). Using the resist pattern 24 as a mask, the silicon nitride film 23 is subjected to etching (FIG. 3(c)), and thereafter implantation of a boron ion is carried out for a channel stopper again using the resist as a mask. After removing the resist (FIG. 3(d)), a 1.2 μm field oxide film 25 is formed within an element isolation area through a selective oxidation using the silicon nitride film 23 as a mask (FIG. 3(e)).

Figure 3F:
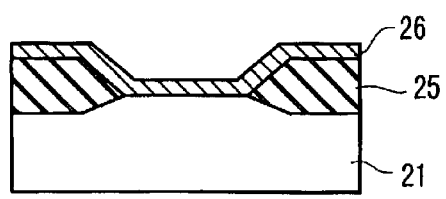
Figure 3C:
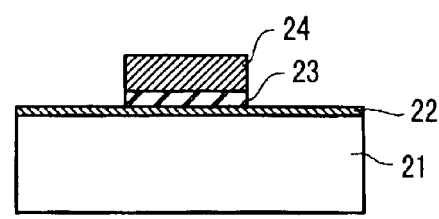
Figure 3G:
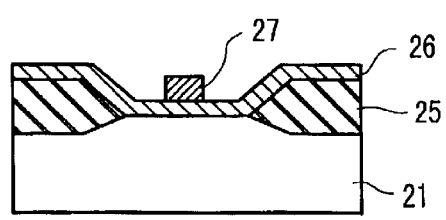
Figure 3D:
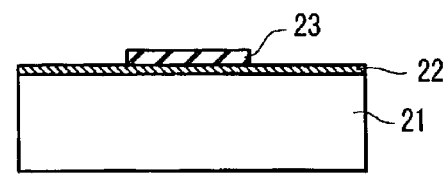
Figure 3H:
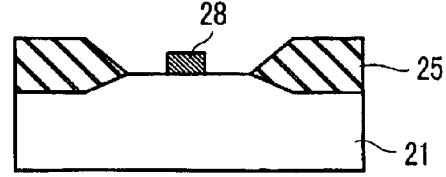

Thereafter, through etching of a layer 12 formed by oxidation of the silicon nitride film 23 and etching of the silicon nitride film 23, the formation of a gate insulation film (not shown in Fig.) and growing of a polycrystalline silicon film 26 are carried out (FIG. 3(f)). On this substrate, a resist pattern 27 having a 0.1 μm line is formed using the pattern-forming method as shown in Mode for carrying out the invention 1 (FIG. 3(g)). Using the resist pattern 27 as a mask, the polycrystalline silicon film 26 is subjected to etching in a conventional manner, thereby forming a gate electrode 28 (FIG. 3(h)). An oxide film thin in both a source and a drain is subjected to etching. Successively, arsenic is diffused to a polycrystalline silicon gate electrode 28, a source 13 and a drain 14, thereby forming an oxide film 20 on the polycrystalline silicon gate electrode 28 and source and drain areas. An aperture is given on the above oxide film 20 to obtain a contact for aluminum-wiring to the gate electrode 28, the source 13 and the drain 14, and then an aluminum-vaporization is carried out thereon. The deposited aluminum film is subjected to patterning, thereby forming a source electrode 16 and a drain electrode 17. Further, a protective film 19 is formed, and an aperture is given on the protective film 19 to obtain a pad for bonding. Thereby, the MOS type transistor as shown in FIG. 2 is formed.

In this paragraph, a method for forming the field oxide film is particularly described. However, it is needless to say that the present invention is not limited thereto and can be applied for a method for fabricating other semiconductor elements and a step therefor.

Incidentally, in this paragraph, a surface of the silicon wafer 21 is oxidized to obtain the field oxide film 25 (element isolation area). However, a groove can be provided within a device area to bury an insulation film therein, thereby attaining minimization.

Further, in this paragraph, a polycrystalline silicon film is used as the gate electrode 28. However, a polycrystalline silicon-metal laminate film or a metal film can be used, thereby decreasing resistance of the gate electrode.

Still further, the resist patterns 24 and 27 used herein comprise the polymer of the acrylic acid ester having a γ-hydroxycarboxylic acid in its ester moiety. However, it is permitted to use a conventional resin having a phenol structure for the pattern 24, which is for an element area larger than the pattern 28 for the gate electrode. Thereby, an existing exposure apparatus (light source of KrF excimer-laser) can be effectively applied for producing semiconductor devices of the highest technology.

Mode for Carrying Out the Invention 9

Figure 4A:
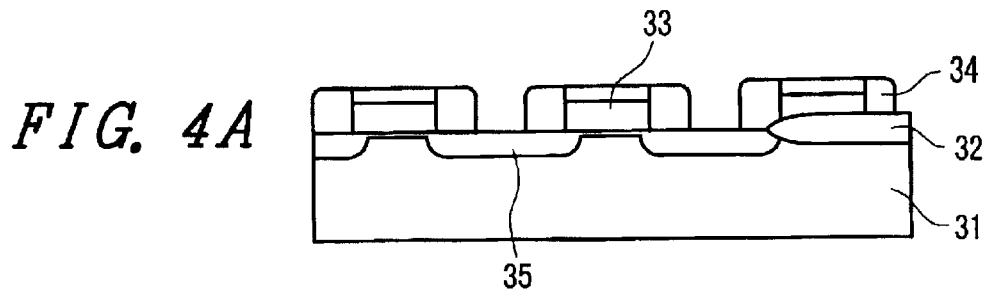
FIG. 4A to FIG. 4D are sectional views showing processes in a method for fabricating a semiconductor memory element using the pattern-forming method in accordance with the present invention.

A semiconductor memory element was obtained according to the pattern-forming method as shown in Mode for carrying out the invention 1. FIG. 4 is a sectional view showing main steps in the production of the element. As shown in FIG. 4(a), using a P-type Si semiconductor 31 for the substrate, an element isolation area 32 is formed on the surface thereof using a known element isolation technique.

Figure 4B:
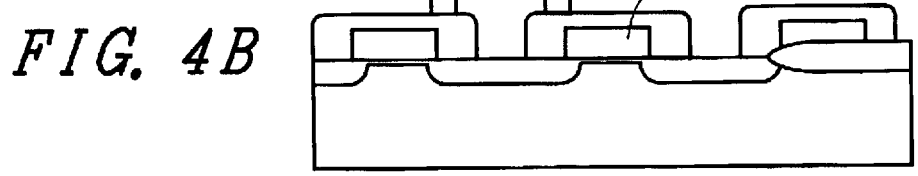
Figure 4C:
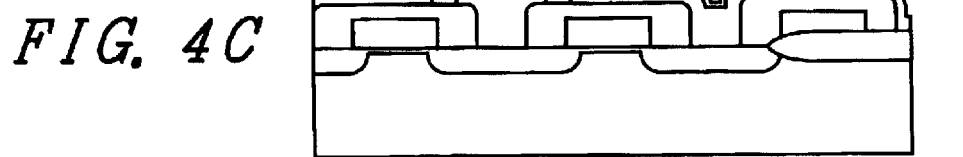
Figure 4D:
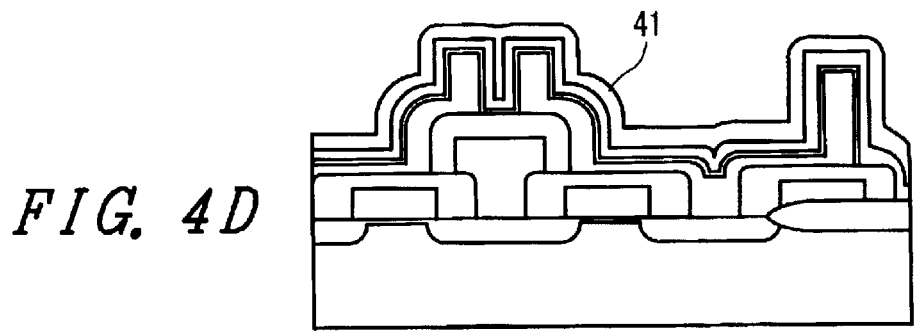

Successively, a word line 33 having a structure formed in a manner such that, for example, a polycrystalline Si of a 150 nm thickness and an $SiO_2$ of a 200 nm thickness are laminated with each other is formed. Further, according to a chemical vapor phase growth method, for example, an $SiO_2$ of 150 nm is attached thereto, and the resultant is anisotropically processed to form an $SiO_2$ side spacer 34 at a side wall of the word line. Successively, an n-diffusion layer 35 is formed in a conventional manner. Successively, as shown in FIG. 4(b), a data line 36 comprising a polycrystalline Si or a high melting point metal silicide, or a laminated film thereof is formed through a usual procedure. Successively, as shown in FIG. 4(c), a storage electrode 38 comprising a polycrystalline Si is formed through a usual procedure. Thereafter, $Ta_2O_5$, $Si_3N_4$, $SiO_2$, BST, PZT, ferrodielectrics or a composite film thereof is attached thereto to form an insulation film for capacitor 39. Successively, a polycrystalline Si, a high melting point metal, a high melting point metal silicide or a low resisting conductor such as Al and Cu is attached thereto to form a plate electrode 40. Successively, as shown in FIG. 4(d), a wiring 41 is formed through a usual procedure. Successively, a memory element is formed through a usual wire-forming procedure or passivation procedure. Incidentally, in this paragraph, only typical production procedures are explained. However, the others can be carried out in each conventional manner. Further, the order of the procedures can be reversed without detriment to application of the present invention. The pattern-forming method in accordance with the present invention as shown in Mode for carrying out the invention 1 was applied for almost all of procedures in the lithography for the production of elements. However, it is not always necessary to apply the present invention for a procedure in which the formation of a pattern with a negative resist is not appropriate, or dimension of the pattern is great. For example, the present invention was not applied for the formation of continuity hole in the passivation procedure and for the formation of mask through ion implantation.

Figure 5:
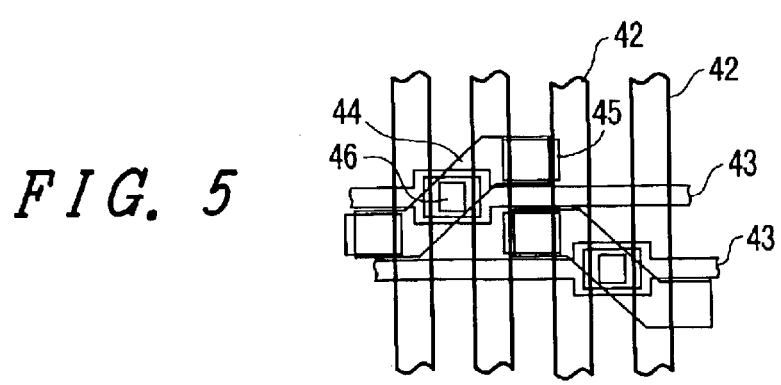
FIG. 5 is a view showing a pattern arrangement of a memory portion of a typical pattern constituting a memory element.

Next, the pattern formed through lithography is explained. FIG. 5 shows a pattern arrangement in a memory portion of a typical pattern constituting the obtained memory element. The pattern comprises a word line 42, a data line 43, an active area 44, a storage electrode 45 and a hole for electrode 46. Also in this example, the pattern-forming method according to Mode for carrying out the invention 1 was used for all excepting the formation of the hole for electrode 46. In addition to the pattern formations as shown here, the present invention was applied to a step wherein a least design rule was used.

In the element obtained according to the present invention, dimension between the patterns could be more minimized as compared with that in the element obtained according to a conventional method. Therefore, the element having the same structure could be minimized to increase the number of them obtainable from one sheet of a wafer at the time of production of the semiconductor element, and as a result, yield was improved.

Mode for Carrying Out the Invention 10

In Mode for carrying out the invention 10, using FIGS. 6(a) to (f) of procedural figures showing production of a semiconductor device, a method for forming copper wiring according to a dual damascene process is explained.

Figure 6A:
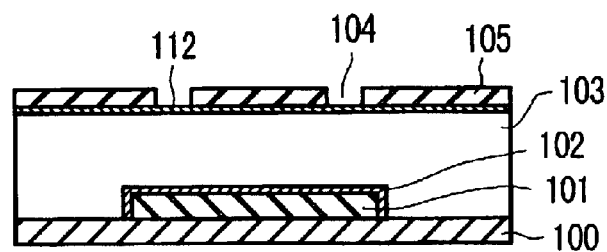
FIG. 6A to FIG. 6F are procedural figures showing the steps of copper-wiring formation using the pattern-forming method in accordance with the present invention, which figures are expressed using sectional views of a semiconductor device.
Figure 6B:
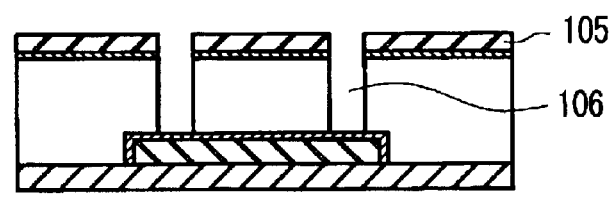
Figure 6C:
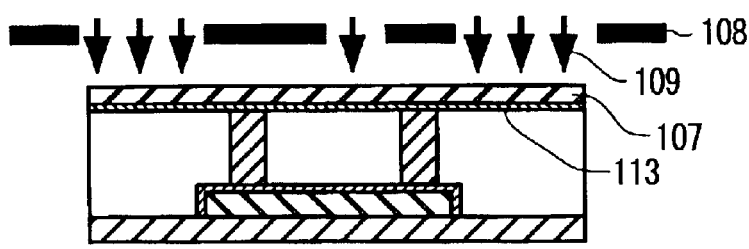
Figure 6D:
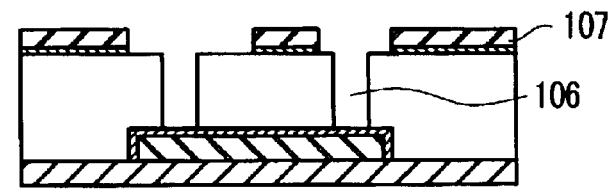

As shown in FIG. 6(a), using a positive resist 105, a resist having a hole pattern for wiring 104 is formed on a substrate 100, a wiring 101, a barrier film 102, an interlayer 103 and a suitable anti-reflective layer 112. Here, for the interlayer, a low dielectric interlayer of a low dielectric organic material, black diamond, porous silicon oxide film or Si-containing polymers such as polysilazane was used. Thereafter, as shown in FIG. 6(b), a hole for wiring 106 is formed on the interlayer through etching process using the positive resist 105 as a mask. Successively, as shown in FIG. 6(c), a suitable anti-reflective layer 113 and a resist 107 as shown in Mode for carrying out the invention 1 are coated thereon, and an ArF excimer-laser exposure light 109 is applied through a mask 108, thereby obtaining a groove pattern for wiring. The exposure was carried out through a lens using an ArF scanner, which is not shown in any figure. The resist is sensitive to ArF excimer-laser light and is characterized in that there is no development swelling, because the insolubilization reaction is a polarity-change reaction wherein a polar group changes to a non-polar group, and moreover an exposure focus latitude is great. As a result, a groove pattern for wiring 107 (FIG. 6(d)) could be formed with a dimension accuracy of ±10%. In addition to such performances, no residual of the resist was observed in the hole for wiring 106. Incidentally, a minimum width of the wiring in the groove pattern was 120 nm. Further, an aqueous tetramethylammonium hydroxide solution was used as a developer, and a concentration thereof within a range of from 0.1 to 0.5 wt % was preferred from a viewpoint of great developing time latitude.

Figure 6E:
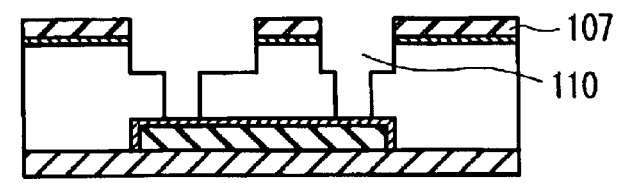
Figure 6F:
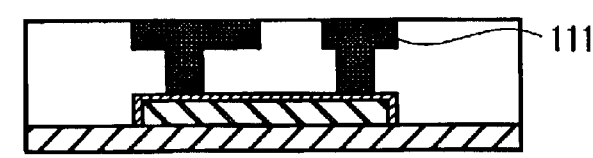

Thereafter, as shown in FIG. 6(e), the interlayer is subjected to etching using the resist pattern 107 as a mask, thereby obtaining a groove for wiring 110. Thereafter, copper is buried in the hole for wiring and the groove, and CMP was applied thereto to form a copper wiring 111 as shown in FIG. 6(f). According to the method mentioned above, wiring with high dimension accuracy and with a high electric reliability freed from problems such as variation of electric resistance and breaking of wire could be formed. In Fig., there are omitted a barrier film, an etching stopper film and a hard mask, which may be used depending upon a kind of a wiring process.

Comparative Example 1

Mode for carrying out the invention 1 was repeated, except that acryloyl chloride was changed to methacryloyl chloride. According to various analyses, the obtained polymer was found to be a copolymer (16) of a methacrylic acid ester having a γ-hydroxycarboxylic acid structure in its ester moiety, wherein a molar ratio of the ester was 20%.

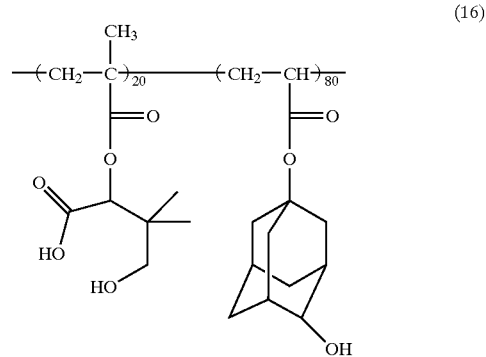

(16)

A molecular weight calibrated with polystyrene standard was examined in tetrahydrofuran according to gel-permeation chromatography, and thereby the weight average molecular weight and the number average molecular weight were found to be 6,500 and 5,300, respectively.

However, a main structure of the resulting methacrylate polymer was found to be more hydrophobic than the acrylate polymers mentioned above, and as a result, the resulting polymer was not dissolved in an alkali developer and therefore could not be used as a negative resist.

With respect to the present invention, the following descriptions are further given.

1. A radiation-sensitive composition containing a polymer of an acrylic acid ester having a γ-hydroxycarboxylic acid in its ester moiety and a photo-acid generator.
2. The radiation-sensitive composition according to the above item 1, wherein the above polymer is a polymer having at least a repeating unit represented by the formula (1), (2) or (3),

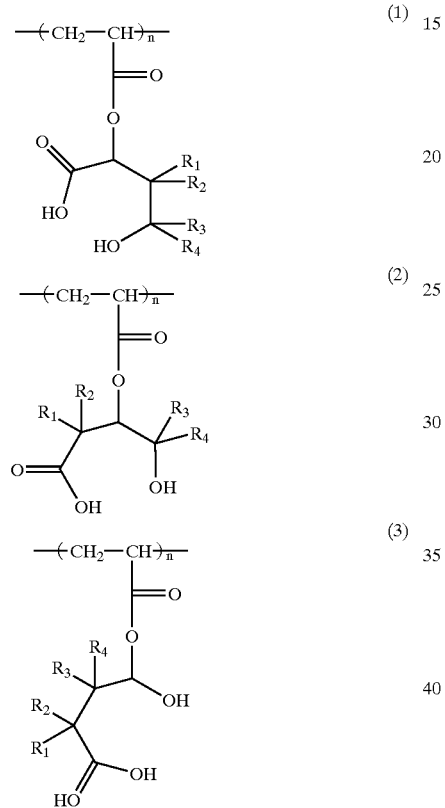

wherein $R^1$, $R^2$, $R^3$ and $R^4$ are independently of one another a hydrogen atom or an alkyl group having 1 to 10 carbon atoms, and these alkyl groups can be bound with one another to form a cyclic alkyl group.

3. The radiation-sensitive composition according to the above item 1 or 2, wherein the above polymer is a copolymer of an acrylic acid ester having a γ-hydroxycarboxylic acid in its ester moiety and an acrylic acid ester other than that or an α-substituted acrylic acid ester.
4. The radiation-sensitive composition according to the above item 3, wherein a molar ratio of the acrylic acid ester having a γ-hydroxycarboxylic acid in its ester moiety in the above-mentioned copolymer is within a range of from 5% (inclusive) to 35% (inclusive).
5. The radiation-sensitive composition according to the above item 3 or 4, wherein the acrylic acid ester other than the acrylic acid ester having a γ-hydroxycarboxylic acid in its ester moiety or the α-substituted acrylic acid ester in the above-mentioned copolymer has an alicyclic group in its ester moiety.
6. The radiation-sensitive composition according to the above item 3 or 4, wherein the acrylic acid ester other than the acrylic acid ester having a γ-hydroxycarboxylic acid in its ester moiety or the α-substituted acrylic acid ester in the above-mentioned copolymer has a fluorinated hydrocarbon group in its ester moiety.
7. The radiation-sensitive composition according to the above item 3 or 4, wherein the acrylic acid ester other than the acrylic acid ester having a γ-hydroxycarboxylic acid in its ester moiety or the α-substituted acrylic acid ester in the above-mentioned copolymer has in its ester moiety a group being capable of decomposing by the action of an acid, thereby increasing a solubility to an alkali developer.
8. A method for forming a pattern comprising:
    the step of forming a coated film comprising the radiation-sensitive composition according to any one of the above items 1 to 7 on a pre-determined substrate;
    the step of irradiating the coated film with an actinic radiation in a pre-determined pattern;
    the step of heating the substrate after the completion of irradiation with an actinic radiation; and
    the step of exposing the coated film to a developer after the completion of heating the substrate.
9. A method for forming a pattern comprising:
    the step of forming a coated film comprising the radiation-sensitive composition according to the above item 7 on a pre-determined substrate;
    a first exposing step of irradiating the coated film with an actinic radiation in a pre-determined pattern;
    a second exposing step of irradiating the coated film with an actinic radiation in an exposure dose more than that in the first exposing step in a pre-determined pattern;
    the step of heating the substrate after the completion of irradiation with an actinic radiation; and
    the step of exposing the coated film to a developer after the completion of heating the substrate.
10. The method for forming a pattern according to the above item 8 or 9, wherein the above actinic radiation is applied through a phase shift mask.
11. The method for forming a pattern according to any one of the above items 8 to 10, wherein the above actinic radiation is a far ultraviolet light having a wavelength of not more than 250 nm.
12. The method for forming a pattern according to any one of the above items 8 to 11, wherein the above actinic radiation is an ArF excimer-laser.
13. The method for forming a pattern according to any one of the above items 8 to 12, wherein the above developer is an aqueous tetramethylammonium hydroxide solution having a concentration of from 0.1% (inclusive) to 0.5% (inclusive).

Effects of the Invention

There can be provided a radiation-sensitive composition which is capable of forming a high resolution negative pattern and is free from causes of resolution deterioration such as swelling due to a permeation of a developer and residual of a resist film between lines of the pattern, by the use of a polymer of an acrylic acid ester having a γ-hydroxycarboxylic acid in its ester moiety. Further, there can be provided a method for forming a pattern using the same, and a method for fabricating a semiconductor device.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method for fabricating a semiconductor device, which comprises:
    the step of arranging a semiconductor substrate;
    the step of coating a radiation-sensitive composition containing a polymer of an acrylic acid ester having a γ-hydroxycarboxylic acid in its ester moiety on the semiconductor substrate, thereby forming a coated film; and
    the step of irradiating the coated film with an actinic radiation, thereby forming a semiconductor circuit pattern.

2. The method for fabricating a semiconductor device according to claim 1, wherein the radiation-sensitive composition further contains a photo-acid generator.

3. The method for fabricating a semiconductor device according to claim 2, wherein the photo-acid generator is contained in the radiation-sensitive composition in an amount of 0.1 to 50 parts by weight, based on the weight of said polymer.

4. The method for fabricating a semiconductor device according to claim 1, wherein the polymer has a repeating unit represented by the formula (1), (2) or (3),

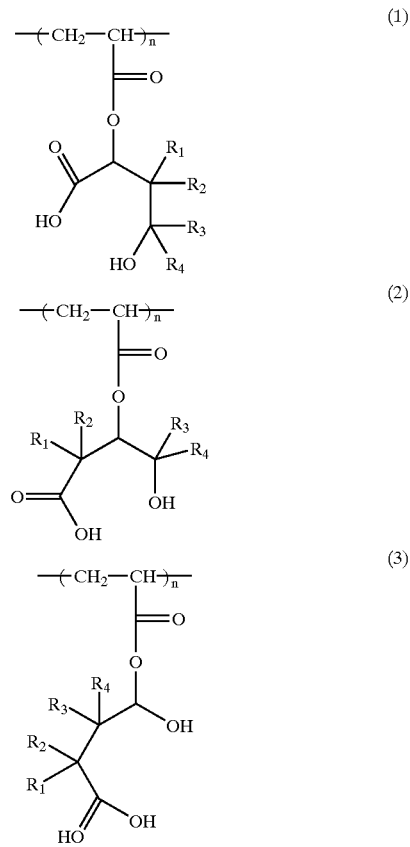

wherein $R^1$, $R^2$, $R^3$ and $R^4$ are independently of one another a hydrogen atom or an alkyl group having 1 to 10 carbon atoms, and these alkyl groups can be bound with one another to form a cyclic alkyl group.

5. The method for fabricating a semiconductor device according to claim 1, wherein the polymer is a copolymer of the acrylic acid ester having a γ-hydroxycarboxylic acid in its ester moiety and an acrylic acid ester other than that or an α-substituted acrylic acid ester.

6. The method for fabricating a semiconductor device according to claim 5, wherein a molar ratio of the acrylic acid ester having a γ-hydroxycarboxylic acid in its ester moiety in the copolymer is within a range of from 5% (inclusive) to 35% (inclusive).

7. The method for fabricating a semiconductor device according to claim 5, wherein the acrylic acid ester other than the acrylic acid ester having a γ-hydroxycarboxylic acid in its ester moiety or the α-substituted acrylic acid ester in the copolymer has an alicyclic group in its ester moiety.

8. The method for fabricating a semiconductor device according to claim 5, wherein the acrylic acid ester other than the acrylic acid ester having a γ-hydroxycarboxylic acid in its ester moiety or the α-substituted acrylic acid ester in the copolymer has a fluorinated hydrocarbon group in its ester moiety.

9. The method for fabricating a semiconductor device according to claim 5, wherein the acrylic acid ester other than the acrylic acid ester having a γ-hydroxycarboxylic acid in its ester moiety or the α-substituted acrylic acid ester in the copolymer has in its ester moiety a group being capable of decomposing by the action of an acid, thereby increasing a solubility to an alkali developer.

10. The method for fabricating a semiconductor device according to claim 5, wherein the acrylic acid ester other than the acrylic acid ester having a γ-hydroxycarboxylic acid in its ester moiety or the α-substituted acrylic acid ester in the copolymer has a polar group in its ester moiety.

11. The method for fabricating a semiconductor device according to claim 1, wherein the irradiation with the actinic radiation is carried out through a phase shift mask.

12. The method for fabricating a semiconductor device according to claim 1, wherein the actinic radiation is a far ultraviolet light having a wavelength of not more than 250 nm.

13. The method for fabricating a semiconductor device according to claim 1, wherein the actinic radiation is an ArF excimer-laser.

14. The method for fabricating a semiconductor device according to claim 1, wherein the coated film irradiated with the actinic radiation is further developed with an aqueous tetramethylammonium hydroxide solution having a concentration of from 0.1 wt % (inclusive) to 0.5 wt % (inclusive).

15. The method for fabricating a semiconductor device according to claim 1, further including the step of etching the substrate or of implanting an ion by the use of the patterned coated film as a mask.

16. The method for fabricating a semiconductor device according to claim 1, wherein the polymer has a weight average molecular weight of from 800 to 500,000.

17. The method for fabricating a semiconductor device according to claim 1, wherein the radiation-sensitive composition further includes a cross-linking agent.

18. A method for fabricating a semiconductor device, which comprises:
    the step of forming a first insulation layer on a substrate;
    the step of forming an electrically conductive layer on the first insulation layer;
    the step of forming a resist film comprising a polymer of an acrylic acid ester having a γ-hydroxycarboxylic acid in its ester moiety on the electrically conductive layer:
    the step of subjecting the resist film to a light exposure and a development, thereby forming the resist film into a desired shape;

the step of removing a region of the electrically conductive layer where the resist film is not formed; and the step of forming a second insulation layer.

19. The method for fabricating a semiconductor device according to claim 18, wherein the first insulation layer is a gate insulation film and the electrically conductive layer is a gate electrode.

20. The method for fabricating a semiconductor device according to claim 18, wherein the resist film is a negative resist film.

21. A method for fabricating a semiconductor device, which comprises:

the step of forming a first electrically conductive layer on a substrate;

the step of forming an insulation film on the first electrically conductive layer;

the step of forming a positive resist film comprising a polymer of an acrylic acid ester having a γ-hydroxycarboxylic acid in its ester moiety on the insulation film;

the step of subjecting the positive resist film to a light exposure and a development, thereby forming an aperture in the positive resist film;

the step of removing the insulation film naked at the aperture of the positive resist film, thereby exposing the first electrically conductive layer; and the step of forming a second electrically conductive layer to be connected with the first electrically conductive layer.

22. The method for fabricating a semiconductor device according to claim 21, wherein the first and second electrically conductive layers comprise copper as a main component.

23. A method for fabricating a semiconductor device, which comprises:

the step of forming a first film on a substrate;

the step of forming a resist film comprising a polymer of an acrylic acid ester having a γ-hydroxycarboxylic acid in its ester moiety on the first film;

the step of subjecting the resist film to a light exposure and a development, thereby forming a resist pattern having a minimum dimension W1;

the step of forming a second film on the substrate;

the step of forming a resist film using a resin having a phenol structure on the second film; and the step of subjecting the resist film on the second film to a light exposure and a development, thereby forming a resist pattern having a minimum dimension W2, which is larger than said W1.

* * * * *